US009391019B2

(12) United States Patent
Kobrinsky et al.

(10) Patent No.: US 9,391,019 B2
(45) Date of Patent: Jul. 12, 2016

(54) SCALABLE INTERCONNECT STRUCTURES WITH SELECTIVE VIA POSTS

(71) Applicant: Intel Corporation, Santa Clara, CA (US)

(72) Inventors: Mauro Kobrinsky, Portland, OR (US); Tatyana Andryushchenko, Portland, OR (US); Ramanan Chebiam, Hillsboro, OR (US); Hui Jae Yoo, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 87 days.

(21) Appl. No.: 14/220,814

(22) Filed: Mar. 20, 2014

(65) Prior Publication Data

US 2015/0270211 A1   Sep. 24, 2015

(51) Int. Cl.
*H01L 23/48*     (2006.01)
*H01L 23/522*    (2006.01)
*H01L 21/768*    (2006.01)
*H01L 23/532*    (2006.01)

(52) U.S. Cl.
CPC ...... *H01L 23/5226* (2013.01); *H01L 21/76805* (2013.01); *H01L 21/76816* (2013.01); *H01L 21/76874* (2013.01); *H01L 21/76879* (2013.01); *H01L 23/53295* (2013.01); *H01L 23/53223* (2013.01); *H01L 23/53238* (2013.01); *H01L 23/53252* (2013.01); *H01L 23/53266* (2013.01)

(58) Field of Classification Search
CPC ................ H01L 21/76807; H01L 21/76838
USPC .................................... 438/622, 641; 257/758
See application file for complete search history.

(56) References Cited

U.S. PATENT DOCUMENTS

| | | | | |
|---|---|---|---|---|
| 5,514,622 A * | 5/1996 | Bornstein | ......... | H01L 21/76895 257/E21.16 |
| 7,115,995 B2 * | 10/2006 | Wong | ................ | H01L 21/02126 257/751 |
| 7,659,196 B2 * | 2/2010 | Abdelrahman | ... | H01L 21/02063 257/E21.575 |
| 7,863,742 B2 * | 1/2011 | Yu | ........................... | H01L 24/13 257/738 |
| 2005/0127419 A1 * | 6/2005 | Hashimoto | .......... | G11C 11/412 257/296 |
| 2006/0226478 A1 * | 10/2006 | Brar | .................... | H01L 29/4175 257/341 |
| 2007/0267751 A1 * | 11/2007 | Yang | ..................... | H01L 21/288 257/758 |
| 2007/0284744 A1 * | 12/2007 | Dubin | ................ | H01L 21/7682 257/751 |
| 2012/0083115 A1 | 4/2012 | Usami | | |

OTHER PUBLICATIONS

International Search Report and Written Opinion of the International Searching Authority for International Application No. PCT/US2015/018935, mailed on Jun. 10, 2015, 25 pages.
Office Action for Taiwan Patent Application No. 104104235, issued Jan. 22, 2016.

* cited by examiner

*Primary Examiner* — Jami M Valentine
(74) *Attorney, Agent, or Firm* — Green, Howard, & Mughal LLP

(57) ABSTRACT

Interconnect structures including a selective via post disposed on a top surface of a lower level interconnect feature, and fabrication techniques to selectively form such a post. Following embodiments herein, a minimum interconnect line spacing may be maintained independent of registration error in a via opening. In embodiments, a selective via post has a bottom lateral dimension smaller than that of a via opening within which the post is disposed. Formation of a conductive via post may be preferential to a top surface of the lower interconnect feature exposed by the via opening. A subsequently deposited dielectric material backfills portions of a via opening extending beyond the interconnect feature where no conductive via post was formed. An upper level interconnect feature is landed on the selective via post to electrically interconnect with the lower level feature.

19 Claims, 10 Drawing Sheets

SCALABLE INTERCONNECT STRUCTURES WITH SELECTIVE VIA POSTS

TECHNICAL FIELD

Embodiments of the invention generally relate to fabrication of integrated circuits (ICs) and monolithic devices, and more particularly pertain to metal interconnect structures.

BACKGROUND

FIG. 1 is a cross-sectional view of a conventional monolithic IC interconnect architecture. Monolithic ICs generally comprise a number passive and/or active devices, such as metal-oxide-semiconductor field-effect transistors (MOSFETs), or the like, fabricated over a substrate 101. These devices are monolithically integrated by levels of metal interconnects embedded within layers of dielectric materials (e.g., 105 and 115) providing electrical isolation. With device dimensions scaling down from one technology generation to the next, it is desirable to also scale down interconnect metal line size and the spacing $CD_s$ between adjacent interconnect lines 110 and 111. However, as dimensions of interconnects scale down, the minimum distance between lines intended to be electrically isolated has decreased very rapidly. This is because the decrease in minimum distance is not only a result of the scaling of the interconnect line spacing $CD_s$, but is also a function of registration error that has generally not improved in pace with dimensional shrinks at each technology generation.

For example, in FIG. 1 the minimum distance $S_1$ between interconnect wires is determined by the spacing between an upper interconnect level via 121, designed to land on lower level metal line 111, and the adjacent lower level metal wire 110, which is spaced apart from line 111 by a minimum design spacing $CD_s$. The registration error or misregistration between interconnect levels (e.g., between via 121 and the lower-level metal lines 110, 111) uncontrollably reduces the minimum design spacing $CD_s$ to $S_1$. Furthermore, as line spacing continues to decrease, line edge roughness becomes a more significant fraction of $CD_s$, increasing susceptibility to time-zero shorts, and to time dependent dielectric breakdown (TDDB) fails during IC device usage.

Because shorts and TDDB fails negatively impact IC device yield and/or device reliability, interconnect architectures that offer greater scalability through increased shorting margin and improved reliability are advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
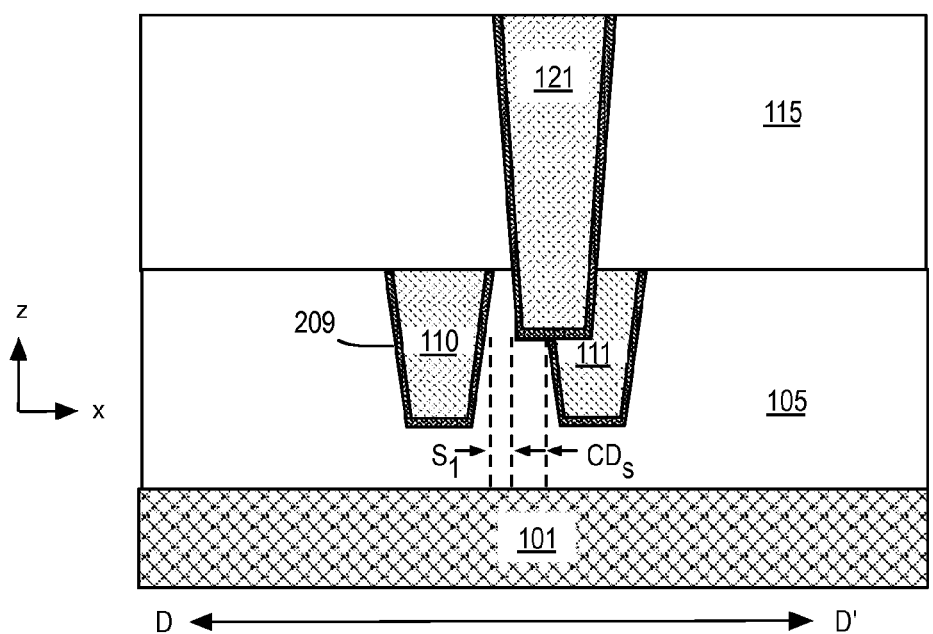
FIG. 1 is a cross-sectional view of a conventional IC interconnect architecture.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or to "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Interconnect structures including a selective via post disposed on a top surface of a lower level interconnect feature, and fabrication techniques to selectively form such a post, are described herein. In embodiments, a selective via post has a bottom lateral dimension smaller than that of a via opening within which the post is disposed. In embodiments, a via post is preferentially deposited on a top surface of an interconnect feature exposed by a via recess patterning. A dielectric material deposited after formation of the conductive via post backfills any portions of the via opening that extend beyond the lateral dimensions of the lower level interconnect feature where no conductive via post was formed. The conductive post electrically connects an upper level interconnect feature landed on the selective via post to lower level interconnect features. Selective growth techniques employed to form the conductive via post and the dielectric backfill of misaligned portions of the via recess may together maintain a minimum interconnect line spacing independent via opening registration error.

Figure 2A:
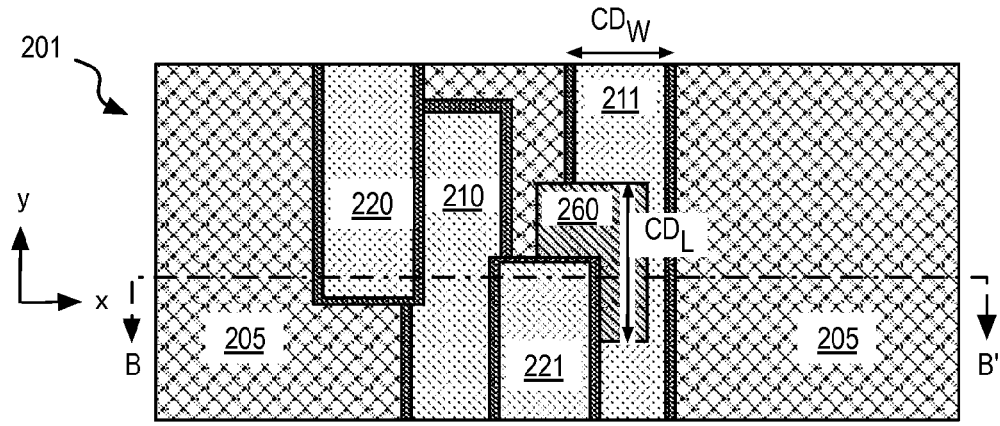
FIG. 2A is a plan view of an IC interconnect architecture including a selective via post, in accordance with an embodiment.
Figure 2B:
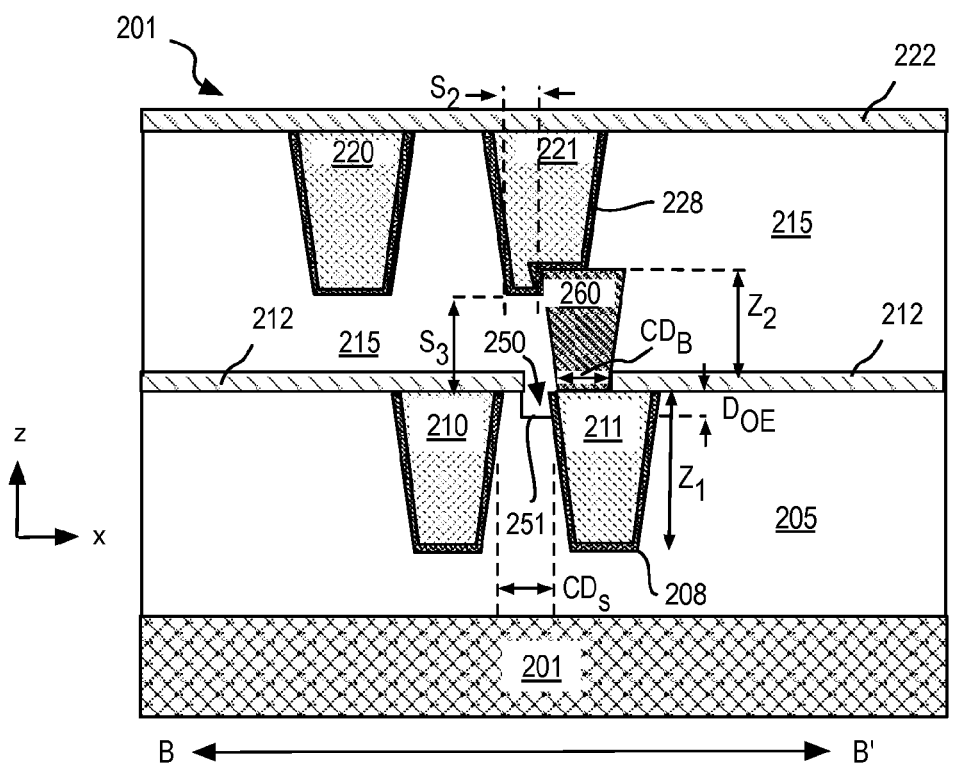
FIG. 2B is a cross-sectional view of the IC interconnect architecture illustrated in FIG. 2A, in accordance with an embodiment.

FIG. 2A is a plan view of an IC interconnect architecture 201 including a selective via post 260, in accordance with an embodiment. FIG. 2B is a cross-sectional view of the IC interconnect architecture 201 along the b-b' plane illustrated in FIG. 2A, in accordance with an embodiment. As shown in FIGS. 2A and 2B, lower level interconnect features 210 and 211 are embedded within a dielectric material 205 over an area of a substrate 205. Active devices (not depicted), such as transistors (e.g., MOSFETs), photodetectors (e.g., PIN diodes), lasers, modulators, and the like are disposed in or on substrate 205. One or more passive device, such as resistors, capacitors, inductors, optical waveguides, and the like may also be disposed in or on substrate 205.

Substrate 205 may be any substrate suitable for forming a monolithically integrated electrical, optical, or microelectromechanical (MEM) device, generally referred to herein as an IC. Exemplary substrates include a semiconductor substrate, semiconductor-on-insulator (SOI) substrate, an insulator substrate (e.g., sapphire), or the like, and/or combinations thereof. In one exemplary embodiment, substrate 205 comprises a substantially monocrystalline semiconductor, such as, but not limited to, silicon. Exemplary semiconductor substrate compositions also include germanium, or group IV alloy systems; group III-V systems, such as GaAs, InP, InGaAs, and the like; or group III-N systems, such as GaN.

Interconnect features 210 and 211 may each be a conductive line, trace, via, or pad, etc. Interconnect features 210, 211 may include any conductive material suitable for seeding or catalyzing a subsequent selective deposition process, as described further elsewhere herein. In exemplary embodiments, interconnect features 210, 211 include a metal composition that provides a catalytic top surface. Exemplary metal compositions include, but are not limited to, copper (Cu), cobalt (Co), Tungsten (W), and alloys thereof. In the illustrated embodiment, interconnect features 210, 211 include an interconnect liner 208 cladding a fill metal. For embodiments herein, the fill metal is of a composition that will provide a catalytic surface for selective deposition of a conductive material or that can be activated (e.g. with Pd) for selective deposition, while liner 208 is advantageously of a material that does not provide a catalytic surface analogous to that of the fill metal. For example, where the catalytic fill metal includes Cu, Ni, W, or Co, the liner does not include Cu, Ni, W, or Co, or the catalytic function of Cu, Ni, W, or Co present within liner 208 has been poisoned, for example through localized impurity doping (e.g., Mn) or chemical deactivation. In addition to advantageously having non-catalytic properties, liner 208 may further be of a material that satisfies traditional interconnect liner functions such as serving as a solid state diffusion barrier, and/or corrosion inhibitor, etc. Suitable non-catalytic liner materials that satisfy one or more of these functions include, but are not limited to, certain refractory metals (e.g., Ta), refractory metal nitrides (e.g., TaN, TiN), refractory metal oxides (e.g., TaO), or non-metallic dielectrics (e.g., $SiO_2$, $Si_3N_4$, SiC, SiCN) of different composition than dielectric material 205. In further embodiments, either or both of a catalytic fill metal and non-catalytic liner may be a laminated material stack or a compositionally inhomogeneous alloy. Interconnect features 210, 211 are separated by a lateral space of dimension $CD_s$, which may be a minimum design rule spacing for coplanar interconnect features in a given interconnect level. Although $CD_s$ may vary with technology node, exemplary embodiments range from 5 nm-60 nm.

Dielectric material 205 may be any dielectric material known in the art to be suitable for electrical isolating interconnect feature 210 from interconnect feature 211. Many such materials are in use, such as, but not limited to, silicon dioxide, silicon nitride, silicon oxynitride, low-k, and ultra low-k materials (e.g., carbon doped silicon dioxide/nitride, porous dielectrics, etc.). As illustrated in FIG. 2B, a top surface of the portion of dielectric material 205 outside of, or beyond, the lateral dimension of via recess 250 is planar with a top surface of interconnect features 210, 211. Via recess 250 defines a non-planarity in dielectric material 205 that exposes a sidewall of interconnect feature 211, which in the exemplary embodiment is a portion of liner 208. Via recess 250 is a physical signature of a dimensional difference and/or registration error between a patterned via opening and interconnect feature 211. Via recess 250 has a depth $D_{OE}$, which is a function of the duration of a patterned etch process employed to form a via opening, as described further elsewhere herein. In exemplary embodiments, $D_{OE}$ is less than half the sidewall z-height $Z_1$ of interconnect feature 211, and is advantageously less than 25% of the interconnect feature sidewall z-height $Z_1$. Via recess 250 may be physically characterized as a moat surrounding more or less of interconnect feature 211 as a function of whether a via opening is of a lateral dimension smaller than, equal to, or greater than a lateral dimension of the interconnect feature which it intersects (e.g., interconnect feature 211 in FIGS. 2A and 2B) and as a function of whether a via opening is misaligned. In the exemplary embodiment depicted, a via opening that exposes a top surface of interconnect features 211 is misaligned relative to interconnect feature 211 such that recess 250 occupies a portion of the spacing between interconnect features 210, 211, but is absent from an opposite side of feature 211. In other words, dielectric material 205 is non-planar along the b-b' plane in FIG. 2B within the interconnect feature spacing having dimension $CD_s$. Via recess 250 may be present along the entire via post length $CD_L$ illustrated in FIG. 2A.

In embodiments, a conductive via post 260 is disposed in contact with a top surface of interconnect feature 211. Via posts in accordance with embodiments may have an unrestricted maximum lateral dimension. For example, via post 260 in FIG. 2 has a y-dimensional length $CD_L$ that may be significantly larger than a minimum x-dimensional (bottom) width $CD_B$ to maintain an acceptably low via resistance. Conductive via post 260 has a minimum bottom lateral dimension no larger than a minimum lateral dimension of the interconnect feature the via post is landed upon. Even where a via opening intersects the entire top surface width $CD_w$, conductive via post 260 will be no larger than $CD_w$ in the x-dimension. Where a via opening intersects less than the entire top surface width $CD_w$, as in FIGS. 2A and 2B, via post 260 has a bottom lateral critical dimension $CD_B$ that is smaller than lateral dimension $CD_w$ of interconnect feature 211.

In advantageous embodiments via post 260 is a "selective" conductive post, which has a minimum bottom lateral critical dimension that is smaller than a lateral dimension of the via opening in which the post is disposed. For example, in FIG. 2B where via recess 250 in the surrounding dielectric 205 evidences a via opening pattern that extended beyond interconnect feature 211, the x-dimensional width of via post 260 ($CD_B$) is smaller than the x-dimensional width of a via opening that includes $CD_B$ and also the x-dimensional width of via recess 250 (a portion of $CD_s$). In further selective via post embodiments, the via post is in contact with a top surface of an interconnect feature but is substantially absent from a sidewall of the interconnect feature exposed by a via recess. In other words, while some trace via post metal may be incidentally disposed on the sidewall of the exposed interconnect feature, no significant portion of the via post intersects the sidewall. As described further below, selective via post deposition processes ensure via post metal deposition upon the interconnect sidewall is much slower than upon the top surface of the interconnect feature. In FIG. 2A for example where recess 250 exposes a sidewall of interconnect feature 211, and more specifically intersects a portion of liner 208, via post 260 extends from the fill metal but is substantially absent from liner 208. Hence, no significant portion of via post 260 is disposed within recess 250. As such, unlike interconnect architecture 101 in FIG. 1, via post 260 does not occupy a portion of the space CDs between adjacent interconnect features 210, 211 that poses a threat of shorting or TDDB failures.

In embodiments, a conductive via post includes one or more metal and/or metal alloy. Any metals known to be suitable for electroplating (e.g., Cu), chemical vapor deposition (e.g., tungsten) and/or atomic layer deposition (e.g., aluminum), respectively. In alternative embodiments, a selective via post is composed of an electroless metal. Exemplary electroless metals include, but are not limited to, nickel (Ni), Copper (Cu), Cobalt (Co), ruthenium (Ru), palladium (Pd), platinum (Pt), or gold (Au), and alloys thereof. As used herein, the term "electroless" refers to a specific material microstructure and/or composition, and is not merely a reference to the process employed to form a via post. Certain electroless metal embodiments for example have relatively high composition (e.g., at least 10-15%) of impurity dopants such as one or more of phosphorus (P), Carbon (C) or boron (B), in addition to their primary metal species (e.g., Ni, Cu, Co, etc.).

In embodiments, a dielectric material is disposed within a via recess adjacent to a selective via post. As shown in FIG. 2B for example, dielectric material 215 is disposed over dielectric material 205 and disposed within via recess 250. With dielectric material 215 disposed within via recess 215, an interface between dielectric material 215 and dielectric material 205 demarks the non-planarity in dielectric material 205 that is backfilled by dielectric material 215. Dielectric material 215 is further in contact with interconnect liner 208 at the end of via recess 250. In further embodiments, a via post is embedded within the dielectric material that is disposed within the via recess with a thickness of that dielectric material exceeding a z-height of the via post. As shown in FIG. 2B, dielectric material 215 has a thickness greater than the via post z-height $Z_2$ and surrounds via post 260, including a portion of the top post surface not contacting upper-level interconnect feature 221.

In further embodiments, dielectric material 215 may be a dielectric stack including at least a base layer and a top layer disposed over the base layer. For such embodiments, the base layer is advantageously conformal (i.e., having a film thickness that is independent of topography) and is disposed within via recess 250, contacting a portion of interconnect liner 208 and forming a cladding around via post 260. This base dielectric layer may serve to passivate and/or protect interconnect structures from a top dielectric layer and/or from the process employed to form the top layer. Exemplary base layer materials include, but are not limited to, $AL_2O_3$, SiN, SiC, and SiCN. The top dielectric layer is advantageously non-conformal, with a thickness exceeding the z-height of via post 260, and with a planar top surface. Dielectric material(s) 215 may include any known dielectric material(s), such as, but not limited to any of those described for dielectric material 205. In certain embodiments, dielectric material 215 disposed within recess 250 has the same composition as dielectric material 205, in which case one or more of dangling bonds, inhomogenous microstructure, or contaminant species still provide demarcation of an interface between dielectric materials 205 and 215.

In embodiments, an intervening dielectric material is disposed between the dielectric materials that form an interface at the via recess. This intervening dielectric material is absent from the via recess and may further demark dimensions of the via opening in which a selective via post is disposed. As shown in FIG. 2B for example, intervening dielectric 212 is disposed between dielectric material 205 and dielectric material 215 everywhere except within via recess 250. Hence, via recess 250 forms a non-planarity in intervening dielectric 212. For embodiments as depicted where that non-planarity passes completely through intervening dielectric 212, via recess 250 is substantially aligned with the opening in intervening dielectric 212. Dielectric material 215 backfills both the opening in intervening dielectric 212 and via recess 250 extending into dielectric 205. Intervening dielectric 212 is further disposed over a top surface of interconnect features 210, 211 in regions where the via post 260 is absent. As also shown in FIG. 2B, intervening dielectric 212 is in contact with via post 260, forming at least a partial perimeter about at least a bottom portion of via post 260. More specifically, as shown in FIG. 2B, a sidewall region of via post 260 disposed over interconnect feature 211 is in physical contact with intervening dielectric 212.

Intervening dielectric 212 may be of any conventional dielectric material composition, including any of those previously described for dielectric material 205 and/or dielectric material 215. In advantageous embodiments, intervening dielectric material 212 is compositionally distinct from dielectric material 205, allowing for etch selectively between the two materials. Exemplary materials include $AL_2O_3$, SiN, SiC, and SiCN. In further embodiments, intervening dielectric material 212 is compositionally distinct from dielectric material 205 and dielectric material 215, for example where dielectric material 205 has the same composition as dielectric material 215. Alternatively, intervening dielectric material 212 has the same composition as at least one of the dielectric materials 205, 215.

In embodiments, a conductive interconnect feature is disposed on a top surface of a via post. As further illustrated in FIGS. 2A and 2B, upper-level interconnect features 220, and 221 are embedded within dielectric material 215. The top surface of interconnect features 220, 221 are planar with a top surface of dielectric material 215. Interconnect features 220, 221 may be pads, vias, or lines. A bottom of interconnect feature 221 contacts a top surface of via post 260. FIGS. 2A and 2B illustrate an exemplary architecture where interconnect feature 221 has a larger lateral dimension than via post 260 and/or there is registration error between feature 221 and via post 260. Interconnect feature 221 extends a lateral distance $S_2$ beyond an edge of the top surface of via post 260 and contacts a portion of the via post sidewall. Depending on via post z-height $Z_2$ and depth of the trench in which interconnect feature 221 is disposed, there is a dielectric-filled space $S_3$ between interconnect feature 210 and feature 221. Via post 260 provides a z-stand off for interconnect feature 221, enabling the space $S_3$ to be arbitrarily larger than interconnect spacing $CD_s$. Hence, because via post 260 is also laterally constrained, or "self-aligned" to the top surface of interconnect structure 211, non-connected interconnect features in architecture 201 are separated by a minimum spacing of at least $CD_s$ instead of suffering the physical encroachment illustrated in FIG. 1.

In embodiments, a top dielectric material is disposed over top surfaces of interconnect features landing on a selective via post. Top dielectric material 222 may have any of the compositions described for dielectric materials 205, 212, or 215. In the exemplary embodiment, dielectric material 222 has the same composition as dielectric material 212 facilitating another iteration of the interconnect structure 201, which may again employ a selective via post to avoid subsequently encroaching the spacing between interconnect features 220, 221.

Figure 3A:
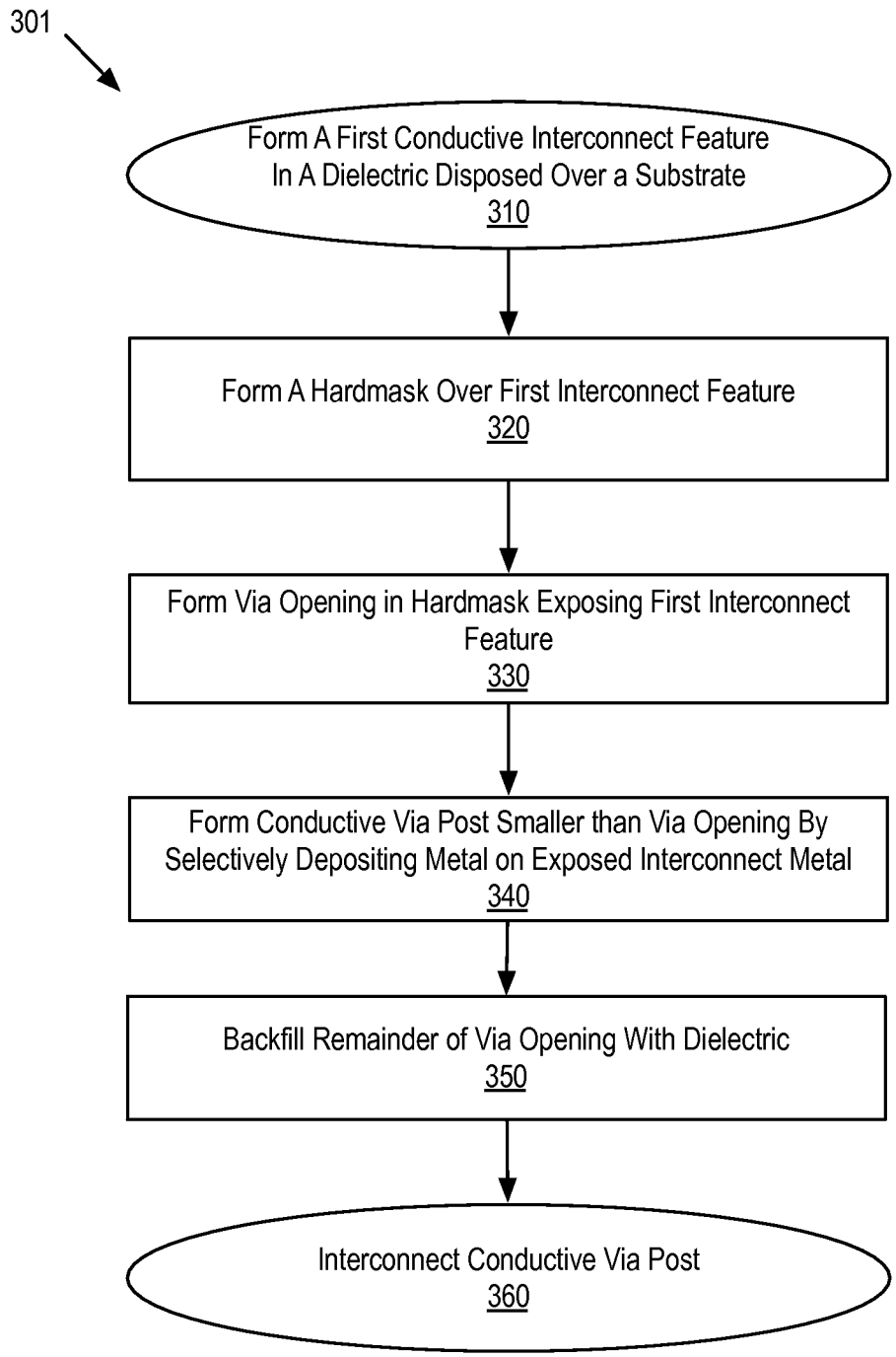
FIG. 3A is a flow diagram illustrating a method of forming an IC interconnect structure with a selective via post, in accordance with an embodiment.

Interconnect structures with a selectively formed via post may be fabricated with a wide variety of techniques. FIG. 3A is a flow diagram illustrating a method 301 for forming an IC interconnect structure with a selectively formed via post, in accordance with one exemplary embodiment. Method 301 may be practiced to fabricate the interconnect structure 201 illustrated in FIGS. 2A, 2B.

Method 301 begins at operation 310 where a first conductive interconnect feature is formed in a dielectric disposed over a substrate. Any fabrication technique may be utilized at operation 301. For example, a damascene or dual damascene process may include etching a trench in a dielectric material, backfilling the trench with interconnect metallization, and polishing back any overburden to leave an electrically isolated interconnect feature within a trench and planarized with the surrounding dielectric material.

Method 301 then proceeds to operation 320 where an etch stop (ES) or an ES and a hardmask is deposited over the interconnect feature(s) formed at operation 310. Any ES and hardmask deposition processes, such as a chemical vapor deposition (CVD), plasma enhanced CVD (PECVD), or spin-on dielectric process may be performed at operation 320. At operation 330, a via opening is patterned into the ES or ES/hardmask stack deposited at operation 320. The via opening may include one or more lithographic mask printing process and hardmask etch and cleans processes known to be suitable for the desired via opening dimensions and ES/hardmask materials. An anisotropic reactive ion etch may be employed at operation 330 to etch through regions of the dielectric ES/hardmask and expose portions of a conductive interconnect feature formed at operation 310, followed by a dry or wet hardmask removal, and a wet clean.

At operation 340, a conductive via post is formed by selectively depositing metal on seeding or catalytic surfaces of the interconnect features exposed by the via opening operation 330. Selective via post deposition processes ensure via post metal deposition upon the interconnect sidewall is much slower than upon the top surface of the interconnect feature. In embodiments, the selective deposition operation includes a catalytic deposition process, such as, but not limited to, one or more of selective CVD, ALD, or electroless deposition. Where the via opening operation 330 exposes a sidewall of an interconnect feature, the selective deposition operation 340 deposits metal on a top surface of the interconnect feature selectively relative to, or preferentially over, the exposed sidewall. Where the via opening operation 330 exposes an underlying dielectric material, the selective deposition operation 340 deposits metal on a top surface of the interconnect feature selectively relative to, or preferentially over, the underlying dielectric material.

At operation 350, a dielectric material is backfilled into any portion of the via opening formed at operation 330, but not filled with metal at the selective post deposition operation 340. Depending on the dielectric deposition process employed at operation 350, a planarization polish may be needed. For example, a chemical mechanical polish (CMP) may follow a CVD dielectric deposition. In other embodiments, a spin-on dielectric deposition is employed at operation 350 without any planarization polish.

At operation 360, the conductive via post formed at operation 340 is interconnected to higher-level metallization. In one exemplary embodiment, operation 360 includes a damascene process. A trench is etched into the dielectric deposited at operation 350 that intersects the via post. Metallization is deposited into the trench to electrically contact the via post, and the metallization is planarized with a top surface of the dielectric deposited at operation 350. Method 301 may be repeated to form additional interconnect metallization levels, as needed for a given IC.

Figure 3B:
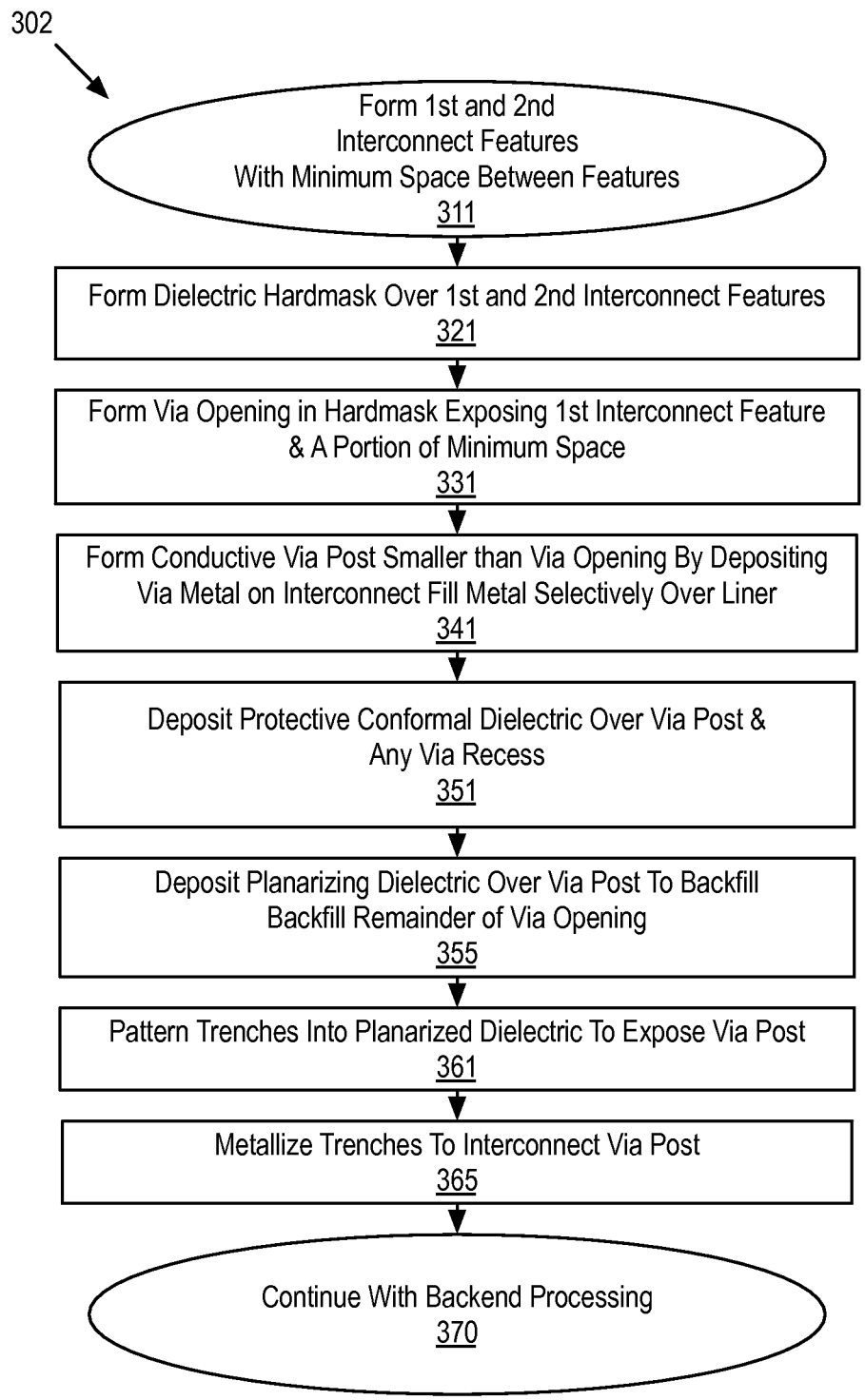
FIG. 3B is a flow diagram illustrating a method of forming an IC interconnect structure with a selective via post, in accordance with an embodiment.

FIG. 3B is a flow diagram illustrating a method 302 for forming an IC interconnect structure with a selective via post, in accordance with a specific embodiment of method 301. FIGS. 4A, 4B, 4C, 4D, 4E, 4F, 4G and 4H are cross-sectional views of an IC interconnect structure including a selective via post evolving as selected operations in method 302 are performed, in accordance with a further embodiment. Reference numbers introduced in FIGS. 2A-2B are retained for corresponding structures further illustrated in FIGS. 4A-4G.

Referring to FIG. 3B, method 302 begins at operation 311 where first and second adjacent interconnect features are embedded within a dielectric material with a minimum space between the features. In the example shown in FIG. 4A, trenches 405 are etched into dielectric 205 with a minimum trench spacing of $CD_s$. In embodiments, a non-catalytic liner material is deposited into trenches 405, and/or the surfaces of trenches 405 are treated to locally poison the catalytic property of a metal subsequently deposited into trenches 405. The liner and/or anti-catalytic surface treatment 208 may be performed even where interconnect features fabricated at operation 311 are otherwise considered liner-less (e.g., lacking a distinct diffusion barrier material, such as Ta, TaN, TiN, etc.). An anti-catalytic surface treatment may also be performed as part of forming lined interconnect features that included distinct diffusion barrier material. The poisoning surface treatment is localized to sidewalls of trenches 405. In one trench surface treatment example, at least the sidewall surfaces of trenches 405 are doped with Mn. In another trench surface treatment example, at least the sidewall surfaces of trenches 405 are treated with silane. In alternate embodiments, a non-catalytic liner material, such as TaN, or a non-metallic dielectric, is deposited into trenches 405. As further shown in FIG. 4B, a catalytic fill metal, such as Cu, Co, or Ni is deposited into trenches 405, over the non-catalytic or poisoned liner 208. In exemplary embodiments the catalytic fill metal is deposited by electrolytic deposition. The interconnect features 210, and 211 are then further delineated through a polish that planarizes the fill metal with dielectric material 205.

Figure 4A:
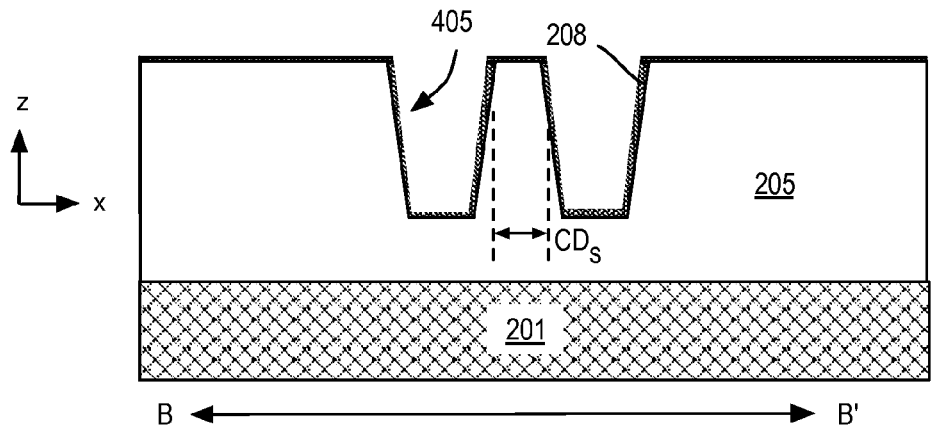
FIGS. 4A, 4B, 4C, 4D, 4E, 4F, 4G, and 4H are cross-sectional views of an IC interconnect structure including a selective via post evolving as selected operations in the method depicted in FIG. 3B are performed, in accordance with an embodiment.
Figure 4B:
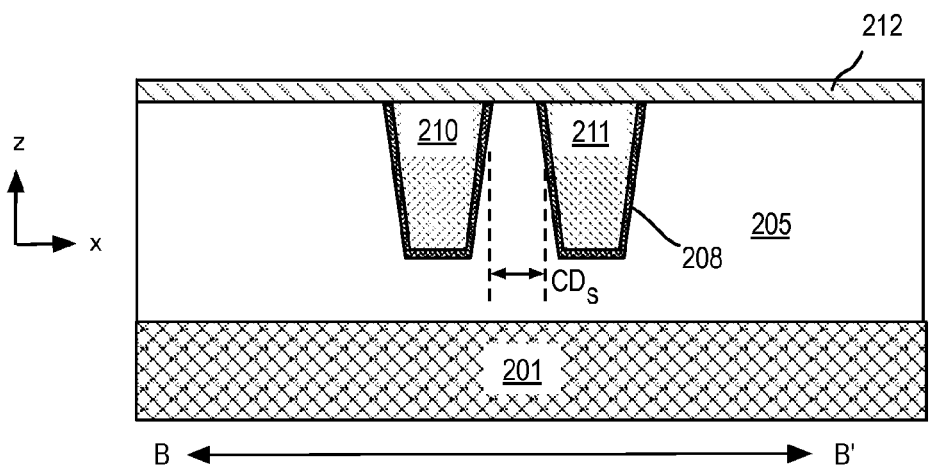
Figure 4C:
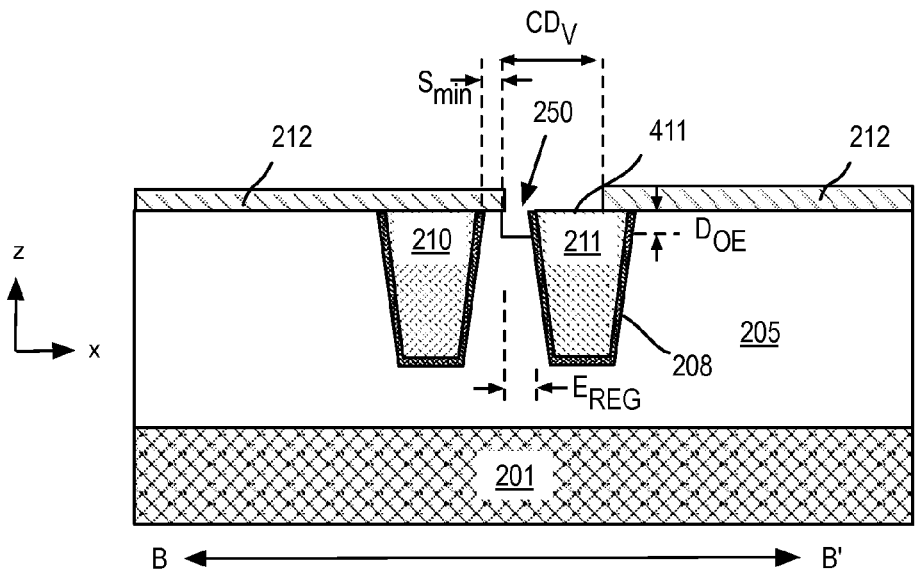

Returning to FIG. 3B, at operation 321 a dielectric ES or ES and a hardmask is deposited over the interconnect feature formed at operation 311. FIG. 4B illustrates an exemplary dielectric material 212 deposited by CVD/PECVD over interconnect features 210, 211 and dielectric material 205. Method 301 continues with forming a via opening by photolithography and etch of the dielectric ES or ES/hardmask stack at operation 331. The via opening exposes a catalyzed top surface of the interconnect feature. In embodiments, the via etch operation 331 also exposes a portion of underlying dielectric material located within the minimum space between the interconnect features. In the exemplary embodiment illustrated in FIG. 4C, a via opening is patterned to have a lateral critical dimension $CD_V$, a portion of which exposes catalyzed top interconnect surface 411. Any etch suitable for the dielectric material 212 may be utilized, and is advantageously a plasma etch process that etches dielectric material 212 preferentially over dielectric material 205 to limit the depth of a via recess 250 formed into dielectric material 205 during the via opening over-etch. As further shown in FIG. 4C, via recess 405 has a lateral dimension along the B-B' plane approximately equal a registration error $E_{reg}$ between the via opening an interconnect feature 211. Via recess is therefore spaced apart from interconnect feature by a smaller lateral distance $S_{min}$. After creating the via opening, if needed, a treatment can be performed to poison the catalytic properties of the liner (208) but not those of the fill metal (211).

Returning to FIG. 3B, method 302 continues at operation 341 where a conductive via post smaller than the via opening patterned at operation 331 is formed by depositing via metal on a catalyzed interconnect metal surface preferentially relative to non-catalyzed surfaces. The conductive via post material does not deposit significantly on any exposed interconnect liner sidewall surfaces, or onto exposed dielectric surfaces, so the post is essentially self-aligned to the top surface of an exposed interconnect feature. In the exemplary embodiment illustrated further in FIG. 4D, via post metal is preferentially deposited upon exposed catalytic top surface 411. Where interconnect top surface 411 exposed by the via opening includes a catalytic fill metal, such as Cu or Co, etc., one or more of Cu or Co, Ni, Ru, Pd, Pt, or Au may be deposited by any applicable selective deposition process. In exemplary embodiments, the via post metal is electrolessly deposited. In alternate embodiments, the via post metal is selectively deposited with a CVD or ALD deposition technique.

Figure 4D:
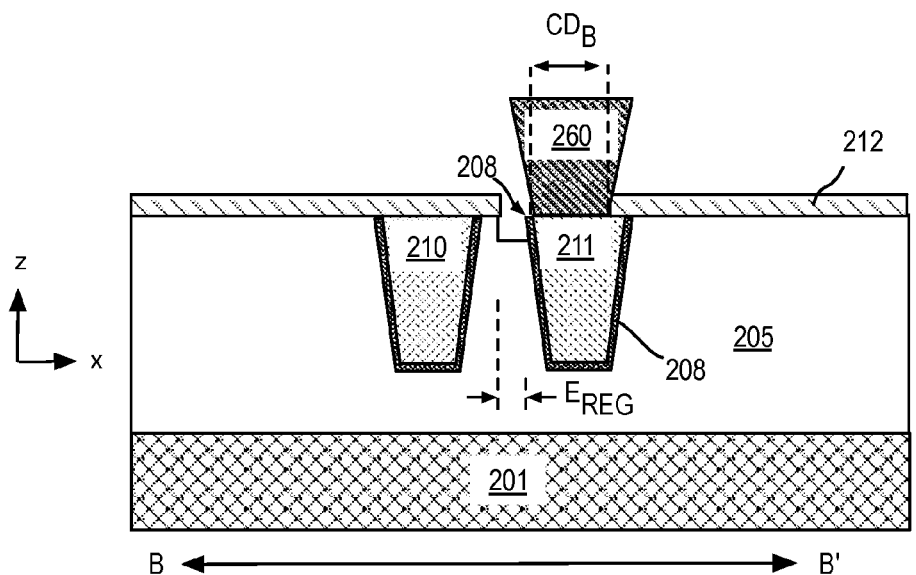

As shown in FIG. 4D, no via post metal forms on liner 208, which was rendered non-catalytic when interconnect feature 211 is fabricated. Similarly, no via post metal forms on dielectric material 205, ensuring via recess 250 remains subsequent to deposition of via post 260. Because of the selective nature of via post deposition operation, via post 260 has a bottom critical dimension $CD_B$ that is smaller than the critical dimension $CB_V$ of the via opening in which the post is formed. Via post 260 may have a top CD larger than $CD_B$ as illustrated in FIG. 4D for embodiments where via post metal deposition proceeds isotropically upon via post metal surfaces.

Figure 4E:
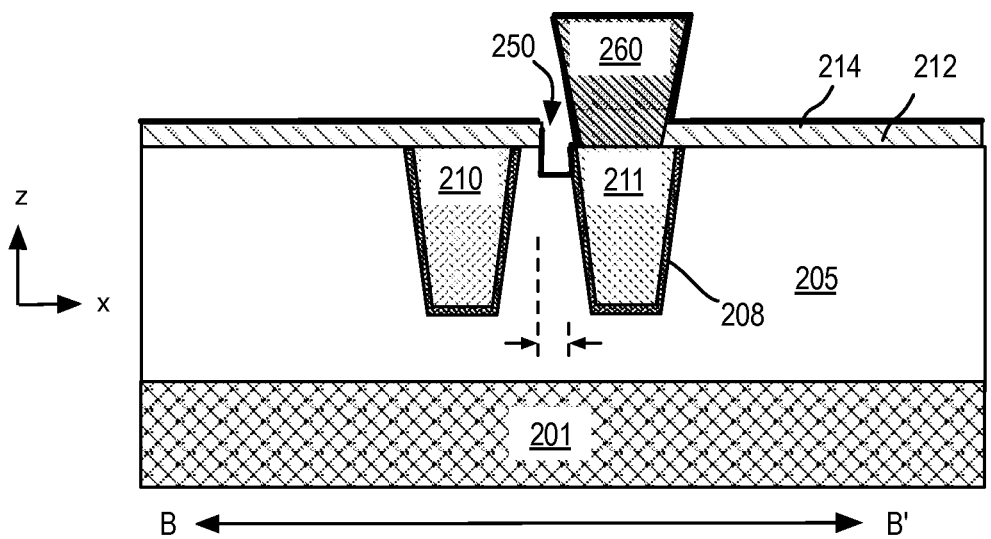

Returning to FIG. 3B, at operation 351 a protective dielectric layer is conformally deposited over the conductive via post formed at operation 341, and over any remaining portion of the via opening that did not catalyze via metal deposition. FIG. 4E illustrates a conformally deposited protective dielectric layer 214. In one embodiment, protective dielectric layer 214 is $Al_2O_3$ deposited by ALD. In alternate embodiments, protective dielectric layer 214 is one or more of SiN, SiC, or SiCN deposited by a CVD/PECVD technique.

Figure 4F:
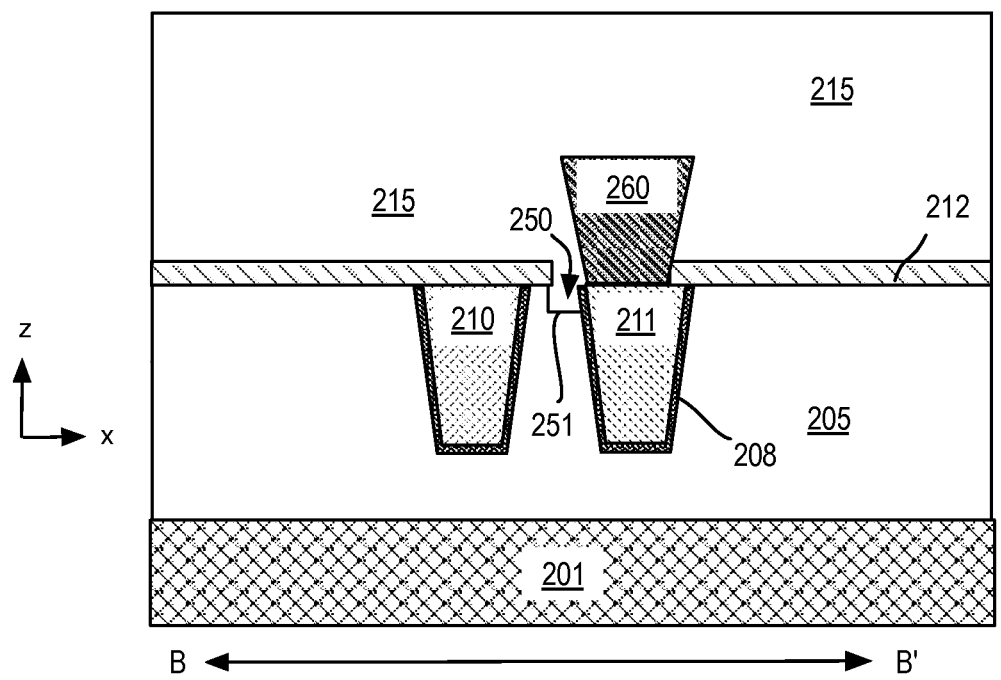

In FIG. 3B, method 302 continues with operation 355 where a planarizing dielectric is deposited over the selective via post, backfilling any via recess remaining from the via opening operation 331. As shown in FIG. 4F, dielectric 215 backfills via recess 250 and forms a planarized surface completely covering conductive via post 260. In one advantageous embodiment, dielectric 215 is non-conformally deposited with a spin-on process, which is self-planarizing. In alternate embodiments, dielectric 215 is non-conformally deposited by CVD/PECVD. If needed, dielectric 215 may be CMP polished to complete planarization.

Figure 4G:
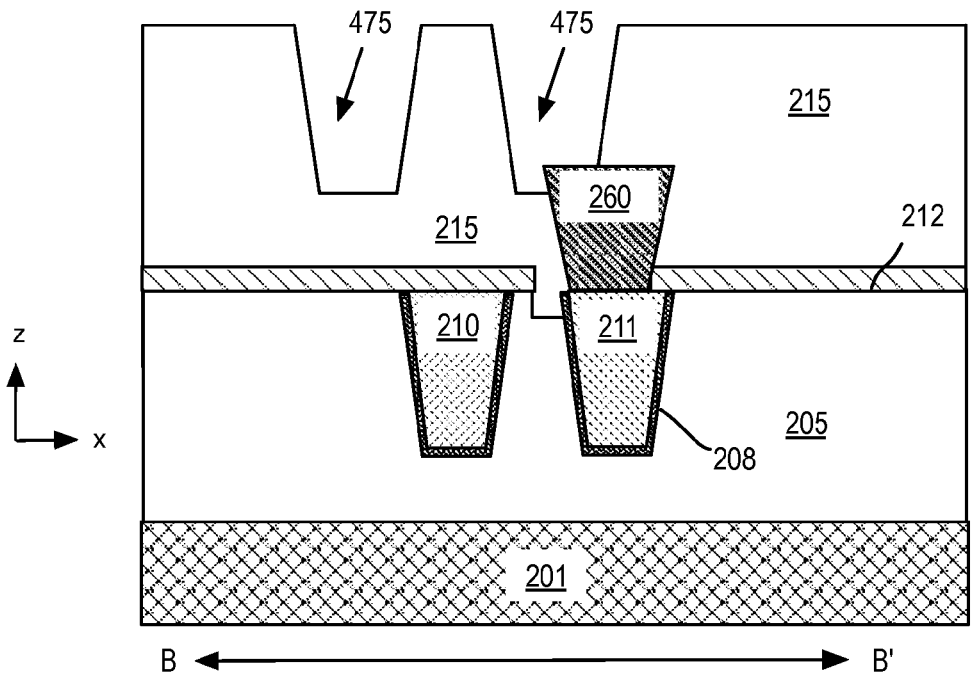
Figure 4H:
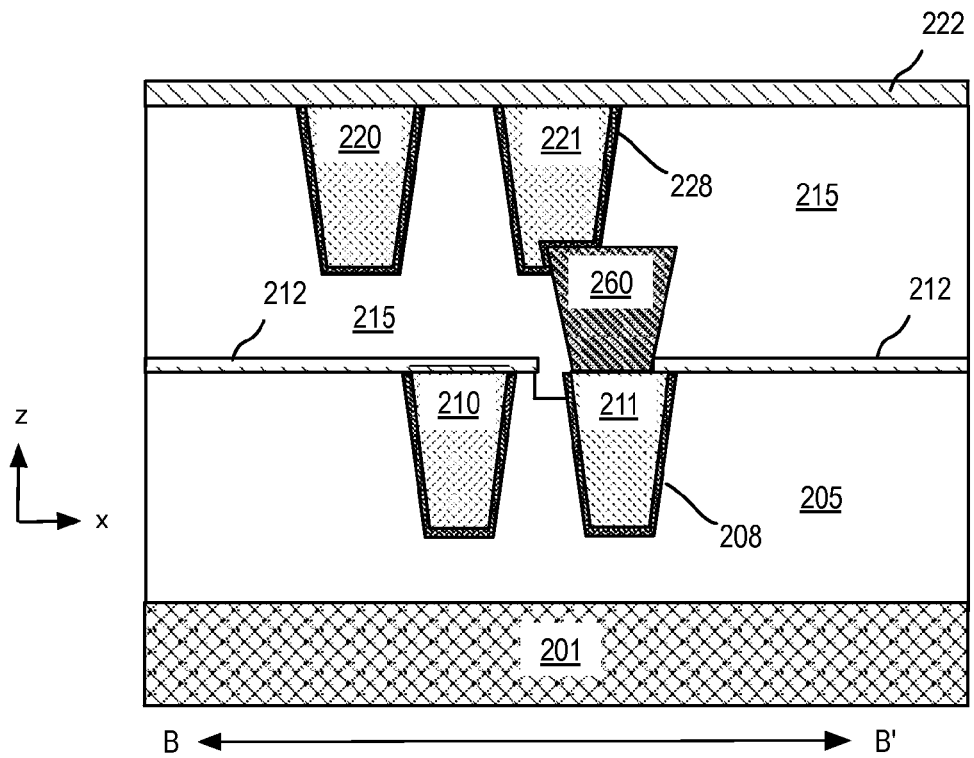

Method 302 continues with operation 361 where recesses are patterned into the dielectric material deposited at operation 355 to enable electrical connection to the conductive via post deposited at operation 351. Referring to FIG. 4G, trenches 475 are lithographically defined and dielectric material 215 etched to expose a surface of conductive via post 260. Any registration error between trenches 475 and via post 260 are mitigated by the via post z-height and corresponding thickness of dielectric material 215. The trenches formed at operation 361 are then metallized to form upper level interconnect features. As further depicted in FIG. 4H, upper level interconnect features 220, 221 may be formed by repeating operation 311 as described above with misregistration, only causing the trench metal to contact the sidewall of via post 260, in addition to the top post surface. Similarly, interconnect features 220, 221 may be passivated with another dielectric layer 222 substantially as described for operation 321. Method 302 then completes with backend processing continuing at operation 370, for example by repeating operations 341-365 for each additional interconnect level. Alternative process flows to generate the structures can also be devised.

Figure 5:
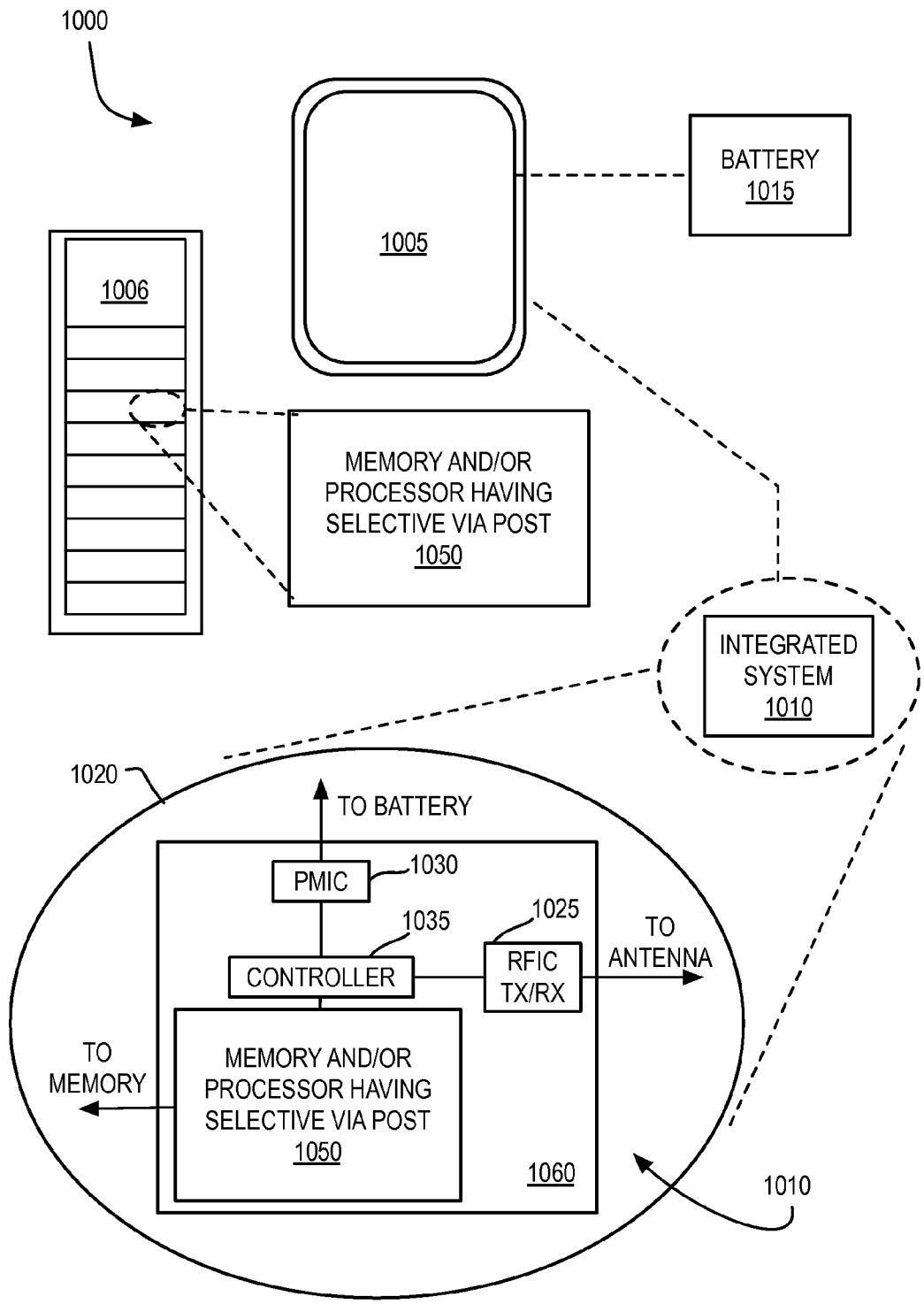
FIG. 5 illustrates a mobile computing platform and a data server machine employing an embedded fuse with conductor backfill in accordance with embodiments of the present invention.

FIG. 5 illustrates a system 1000 in which a mobile computing platform 1005 and/or a data server machine 1006 employs an IC interconnected, at least in part, by a self-aligned, selective via post in accordance with embodiments of the present invention. The server machine 1006 may be any commercial server, for example including any number of high-performance computing platforms disposed within a rack and networked together for electronic data processing, which in the exemplary embodiment includes a packaged monolithic IC 1050. The mobile computing platform 1005 may be any portable device configured for each of electronic data display, electronic data processing, wireless electronic data transmission, or the like. For example, the mobile computing platform 1005 may be any of a tablet, a smart phone, laptop computer, etc., and may include a display screen (e.g., a capacitive, inductive, resistive, or optical touchscreen), a chip-level or package-level integrated system 1010, and a battery 1015.

Whether disposed within the integrated system 1010 illustrated in the expanded view 1020, or as a stand-alone packaged chip within the server machine 1006, packaged monolithic IC 1050 includes a memory chip (e.g., RAM), or a processor chip (e.g., a microprocessor, a multi-core microprocessor, graphics processor, or the like) employing a self-aligned, selective via post, for example as describe elsewhere herein. The monolithic IC 1050 may be further coupled to a board, a substrate, or an interposer 1060 along with, one or more of a power management integrated circuit (PMIC) 1030, RF (wireless) integrated circuit (RFIC) 1025 including a wideband RF (wireless) transmitter and/or receiver (TX/RX) (e.g., including a digital baseband and an analog front end module further comprises a power amplifier on a transmit path and a low noise amplifier on a receive path), and a controller thereof 1035.

Functionally, PMIC 1030 may perform battery power regulation, DC-to-DC conversion, etc., and so has an input coupled to battery 1015 and with an output providing a current supply to other functional modules. As further illustrated, in the exemplary embodiment, RFIC 1025 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 1050 or within a single IC coupled to the package substrate of the monolithic IC 1050.

Figure 6:
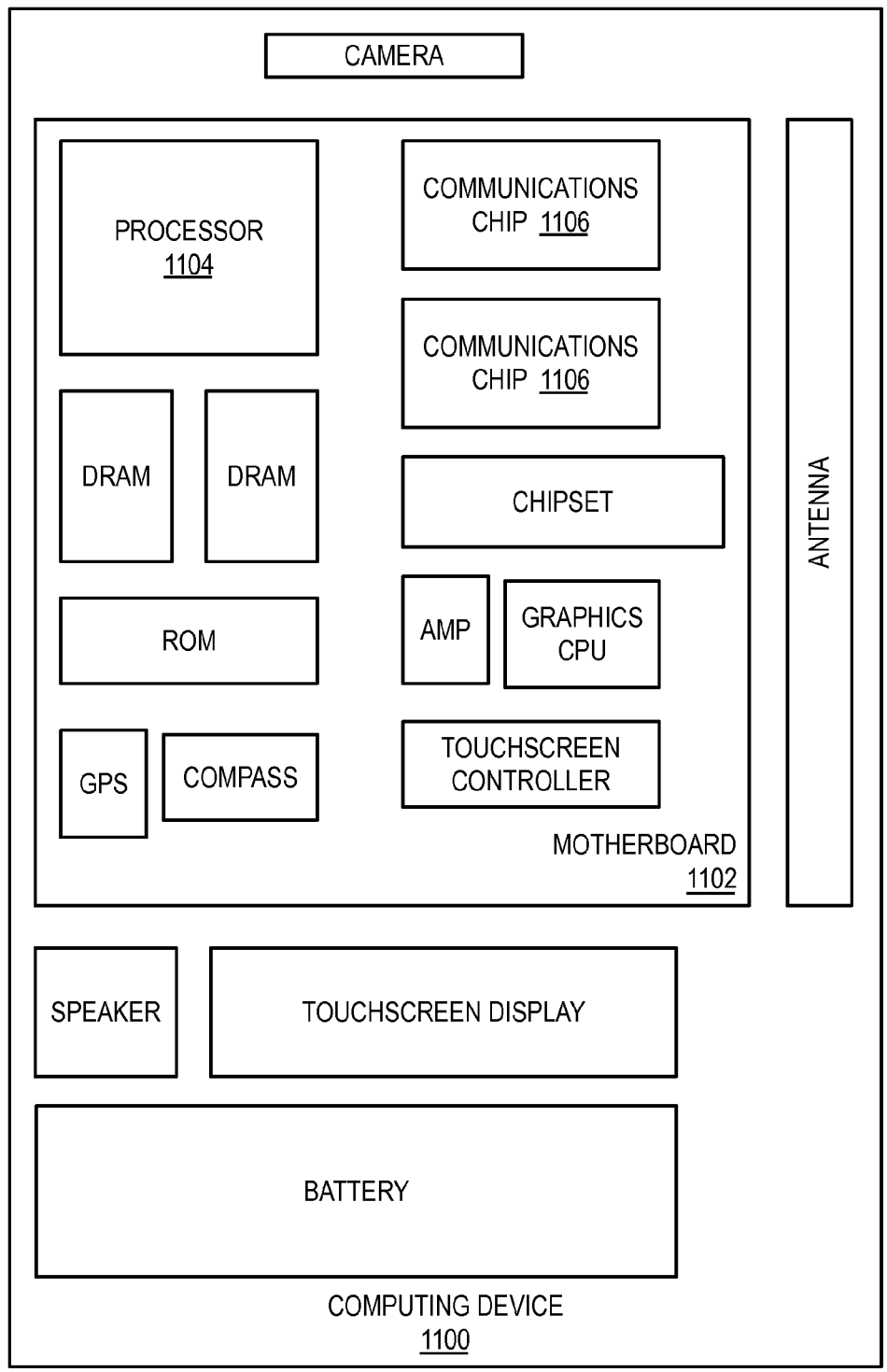
FIG. 6 is a functional block diagram of an electronic computing device, in accordance with an embodiment of the present invention.

FIG. 6 is a functional block diagram of a computing device 1100, arranged in accordance with at least some implementations of the present disclosure. Computing device 1100 may be found inside platform 1005 or server machine 1006, for example. Device 1100 further includes a motherboard 1102 hosting a number of components, such as, but not limited to, a processor 1104 (e.g., an applications processor), which may further incorporate a self-aligned, selective via post in accordance with embodiments of the present invention. Processor 1104 may be physically and/or electrically coupled to motherboard 1102. In some examples, processor 1104 includes an integrated circuit die packaged within the processor 1104. In general, the term "processor" or "microprocessor" may refer to any device or portion of a device that processes electronic data from registers and/or memory to transform that electronic data into other electronic data that may be further stored in registers and/or memory.

In various examples, one or more communication chips 1106 may also be physically and/or electrically coupled to the motherboard 1102. In further implementations, communication chips 1106 may be part of processor 1104. Depending on its applications, computing device 1100 may include other components that may or may not be physically and electrically coupled to motherboard 1102. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1106 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1106 may implement any of a number of wireless standards or protocols, including but not limited to those described elsewhere herein. As discussed, computing device 1100 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. The above embodiments may include specific combination of features. For example:

In one or more first embodiment, an integrated circuit (IC) interconnect structure, includes a conductive interconnect feature embedded within a first dielectric material disposed over a substrate. The IC structure further includes a via recess overlapping a sidewall of the interconnect feature, wherein the via recess defines a non-planarity in the first dielectric material, or in an intervening dielectric material disposed between the first dielectric material and a second dielectric material disposed over the intervening dielectric material. The IC structure further includes a conductive via post disposed in contact with a top surface of the interconnect feature, wherein the second dielectric material is further disposed within the via recess.

In furtherance of the one or more first embodiment, the via recess defines a non-planarity in the first dielectric material that exposes the sidewall of the interconnect feature. The conductive via post is substantially absent from the interconnect feature sidewall. A top surface of the first dielectric layer beyond a lateral dimension of the via recess is planar with the top surface of the interconnect feature, and he first and second dielectric materials form an interface demarking the via recess.

In furtherance of the one or more first embodiment, the first and second dielectric materials form an interface demarking the via recess; and the interconnect structure further comprises an intervening dielectric material disposed between the first and second dielectric material in regions where the via recess is absent, and further disposed over the top surface of the interconnect feature in regions where the via post is absent.

In furtherance of the one or more first embodiment, the interconnect line comprises a fill metal of a first composition, and an interconnect liner of a second composition cladding the sidewalls of the fill metal. The via post is in contact with the fill metal, and the second dielectric material disposed within the recess is in contact with the interconnect liner.

In furtherance of the one or more first embodiment, the interconnect line comprises a fill metal of a first metal composition suitable for electroless formation of the via post material, and an interconnect liner cladding the sidewalls of the fill metal, the liner being of a second composition unsuitable for electroless formation of the via post material.

In furtherance of the one or more first embodiment, the via post comprises at least one of Ni, Cu, Co, Ru, Pd, Pt, or Au, and is doped with P, C, W, or B impurities. The interconnect liner comprises a fill metal, and an interconnect liner cladding the sidewalls of the fill metal, the liner further comprising a metal nitride, a metal oxide, or a non-metallic dielectric having a composition distinct from the first dielectric material.

In furtherance of the one or more first embodiment, the via post is embedded within the second dielectric material, with a thickness of the second dielectric material exceeding a z-height of the via post.

In furtherance of the one or more first embodiment, the via post is embedded within the second dielectric material, with a thickness of the second dielectric material exceeding a z-height of the via post. The second dielectric material comprises a dielectric stack including a conformal base layer disposed within the via recess and cladding the via post, and a non-conformal top layer disposed over the base layer, the top layer having a thickness exceeding a z-height of the via post.

In furtherance of the one or more first embodiment, a second conductive interconnect feature is disposed on a top surface of the via post, the second conductive feature extending beyond an edge of the top via post surface and contacting a portion of a sidewall of the via post.

In furtherance of the one or more first embodiment, the conductive interconnect feature is one of a pair of interconnect features embedded within the first dielectric material and spaced laterally apart by a first space. The via recess is disposed within the first space. A bottom of the via post in contact with a top surface of a first of the pair of interconnect features is laterally spaced apart from a top surface of the second of the pair of interconnect structures by at least the first space.

In one or more second embodiment, a method of fabricating an integrated circuit (IC) interconnect structure includes forming a conductive interconnect feature embedded within a first dielectric material over a substrate. The method further includes patterning a via opening that exposes a top surface and a sidewall of the conductive interconnect feature. The method further includes forming a conductive via post on the top surface of the interconnect feature selectively relative to the sidewall.

In furtherance of the one or more second embodiment, the conductive interconnect feature further comprises cladding a fill metal of a first metal composition suitable for catalyzing a subsequent electroless deposition with a liner material unsuitable for catalyzing the subsequent electroless deposition. Forming the conductive via post further comprises electrolessly depositing a via metal on the catalytic fill metal without depositing the via metal on the non-catalytic liner.

In furtherance of the one or more second embodiment, a second dielectric material is deposited over the first dielectric material, over the sidewall of the conductive interconnect feature, and over a sidewall of the via post.

In furtherance of the one or more second embodiment, a second dielectric material is deposited over the first dielectric material, over the sidewall of the conductive interconnect feature, and over a sidewall of the via post. The second dielectric material deposition further comprises conformally depositing a base dielectric layer onto the sidewall of the conductive interconnect feature, and over a sidewall of the via post, and non-conformally depositing a top dielectric layer over the base dielectric layer to planarize a top surface of the top dielectric layer over a top surface of the via post.

In furtherance of the one or more second embodiment, the method further comprising depositing an intervening dielectric material over the top surface of the interconnect feature and over the first dielectric material. Patterning the via opening further comprises etching through the intervening dielectric material to expose a portion of both the interconnect feature and form a via recess in the first dielectric material adjacent to the interconnect feature. The method further comprises depositing a second dielectric material over the intervening dielectric material and the via post to fill the via recess.

In furtherance of the one or more second embodiment, the method further comprises surrounding the via post with a second dielectric material. The method further comprises etching a second recess into the second dielectric material exposing a top surface of the via post, the second recess extending beyond an edge of the top via post surface and exposing a portion of a sidewall of the via post. The method further comprises depositing a second interconnect feature within the second recess, the second interconnect feature contacting the top surface and sidewall of the via post.

In one or more third embodiment, a method of forming an integrated circuit (IC) includes forming a first interconnect feature and a second interconnect feature over a substrate, with a first dielectric material disposed between the first and second features planarized with top surfaces of the first and second interconnect features. The method further includes depositing an intervening dielectric layer over the first and second interconnect features and over the first dielectric material between the first and second features. The method further includes patterning an opening through the intervening dielectric layer that exposes a top surface of the first interconnect feature and recesses at least a portion of the first dielectric material top surface between the first a second interconnect features. The method further includes forming a conductive via post by depositing a metal on the top surface of the first interconnect feature without depositing the metal in the recessed portion of the first dielectric material. The method further includes backfilling the recessed portion of the first dielectric material with a second dielectric material.

In furtherance of the one or more third embodiment, forming the conductive via post further comprises selectively depositing at least one of Ni, Cu, Co, Ru, Pd, Pt, or Au.

Forming the first and second interconnect features further comprises cladding a fill metal conducive of the selective depositing with a liner that suppresses the electroless depositing.

In furtherance of the one or more third embodiment, cladding the fill metal with the further comprises selectively poisoning sidewalls of the first and second interconnect features.

In furtherance of the one or more third embodiment, backfilling the recessed portion of the first dielectric material further comprises conformally depositing a base dielectric layer onto the sidewall of the conductive interconnect feature, and over a sidewall of the via post, and non-conformally depositing a top dielectric layer over the base dielectric layer to planarize a top surface of the top dielectric layer over a top surface of the via post.

In one or more fourth embodiment, an integrated circuit (IC) interconnect structure, includes a pair of first conductive interconnect features embedded within a first dielectric material disposed over a substrate and spaced laterally apart by a first space, and a conductive via post disposed in contact with a top surface one of the interconnect features. The IC structure further includes a second conductive interconnect feature embedded within a second dielectric material disposed over the first dielectric material, and disposed in contact with a top surface of the via post, wherein the second interconnect feature is laterally misaligned from the via post with a bottom surface of the interconnect feature overlapping the first space.

In furtherance of the one or more fourth embodiment, the IC structure further includes an intervening dielectric material disposed over the top surface of the interconnect feature in regions where the via post is absent, and wherein the intervening dielectric material is further absent from at least a portion of the first space.

In furtherance of the one or more fourth embodiment, the pair of first interconnect features comprises a pair of interconnect lines including a fill metal of a first composition, and an interconnect liner of a second composition cladding the sidewalls of the fill metal. The second interconnect feature comprises a third interconnect line including the fill metal, and the interconnect liner cladding the sidewalls of the fill metal. The via post is in contact with the fill metal of one of the pair of first interconnect features and is in contact with a interconnect liner cladding of the third interconnect line. The via post has a third composition, distinct from the interconnect fill metal and cladding.

In furtherance of the one or more fourth embodiment, the via post comprises at least one of Ni, Cu, Co, Ru, Pd, Pt, or Au, and is doped with P, C, W, or B impurities.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) interconnect structure, comprising:
    a conductive interconnect feature embedded within a first dielectric material disposed over a substrate;
    a via recess overlapping a sidewall of the interconnect feature;
    a conductive via post disposed in direct contact with a top surface of the interconnect feature; and
    a second dielectric material disposed within the via recess and in direct contact with the sidewall of the interconnect feature, wherein the via recess defines a non-planarity in the first dielectric material, or in an intervening dielectric material disposed between the first dielectric material and the second dielectric material.

2. The IC interconnect structure of claim 1, wherein
    the via recess defines a non-planarity in the first dielectric material that exposes the sidewall of the interconnect feature;
    the conductive via post is substantially absent from the interconnect feature sidewall;
    a top surface of the first dielectric layer beyond a lateral dimension of the via recess is planar with the top surface of the interconnect feature; and
    the first and second dielectric materials form an interface demarking the via recess.

3. The IC interconnect structure of claim 1, wherein the first and second dielectric materials form an interface demarking the via recess; and
    wherein the intervening dielectric material is disposed between the first and second dielectric material in regions where the via recess is absent, and further disposed over the top surface of the interconnect feature in regions where the via post is absent.

4. The IC interconnect structure of claim 1, wherein:
    the interconnect feature comprises a fill metal of a first composition, and an interconnect liner of a second composition cladding the sidewalls of the fill metal;
    the via post is in contact with the fill metal; and
    the second dielectric material disposed within the recess is in contact with the interconnect liner.

5. The IC interconnect structure of claim 1, wherein the interconnect feature comprises:
    a fill metal of a first metal composition suitable for electroless formation of the via post material; and
    an interconnect liner cladding sidewalls of the fill metal, the liner being of a second composition unsuitable for electroless formation of the via post material.

6. The IC interconnect structure of claim 1, wherein:
    the via post comprises at least one of Ni, Cu, Co, Ru, Pd, Pt, or Au, and is doped with P, C, W, or B impurities; and
    the interconnect feature comprises:
        a fill metal; and
        an interconnect liner cladding sidewalls of the fill metal, the liner further comprising a metal nitride, a metal oxide, or a non-metallic dielectric having a composition distinct from the first dielectric material.

7. The IC interconnect structure of claim 1, wherein:
    the via post is embedded within the second dielectric material, with a thickness of the second dielectric material exceeding a vertical height of the via post.

8. The IC interconnect structure of claim 1, wherein:
    the via post is embedded within the second dielectric material, with a thickness of the second dielectric material exceeding a vertical height of the via post; and
    the second dielectric material comprises a dielectric stack including:
        a conformal base layer disposed within the via recess and cladding the via post; and
        a non-conformal top layer disposed over the base layer, the top layer having a thickness sufficient to cover a top surface of the via post.

9. The IC interconnect structure of claim 1, further comprising:
    a second conductive interconnect feature disposed on a top surface of the via post, the second conductive feature extending beyond an edge of the top via post surface and contacting a portion of a sidewall of the via post.

10. The IC interconnect structure of claim 1, wherein:
the conductive interconnect feature is one of a pair of interconnect features embedded within the first dielectric material and spaced laterally apart by a first space;
the via recess is disposed within the first space; and
a bottom of the via post in contact with a top surface of a first of the pair of interconnect features is laterally spaced apart from a top surface of the second of the pair of interconnect structures by at least the first space.

11. A method of fabricating an integrated circuit (IC) interconnect structure, the method comprising:
forming a conductive interconnect feature embedded within a first dielectric material over a substrate;
patterning a via opening that exposes a top surface and a sidewall of the conductive interconnect feature;
forming a conductive via post in direct contact with the top surface of the interconnect feature selectively relative to the exposed sidewall; and
depositing a second dielectric material within the via opening, over the first dielectric material, in direct contact with the exposed conductive interconnect feature sidewall, and over a sidewall of the via post, wherein the via opening defines a non-planarity in the first dielectric material, or in an intervening dielectric material disposed between the first dielectric material and the second dielectric material.

12. The method of claim 11, wherein:
forming the conductive interconnect feature further comprises cladding a fill metal of a first metal composition suitable for catalyzing a subsequent electroless deposition with a liner material unsuitable for catalyzing the subsequent electroless deposition; and
forming the conductive via post further comprises electrolessly depositing a via metal on the catalytic fill metal without depositing the via metal on the non-catalytic liner.

13. The method of claim 11, wherein depositing the second dielectric material further comprises:
conformally depositing a base dielectric layer onto the sidewall of the conductive interconnect feature, and over a sidewall of the via post; and
non-conformally depositing a top dielectric layer over the base dielectric layer to planarize a top surface of the top dielectric layer over a top surface of the via post.

14. The method of claim 11, further comprising depositing an intervening dielectric material over the top surface of the interconnect feature and over the first dielectric material; wherein:
patterning the via opening further comprises etching through the intervening dielectric material to expose a portion of the interconnect feature top surface and form a via recess in the first dielectric material adjacent to the interconnect feature that exposes the conductive interconnect feature sidewall; and
wherein depositing the second dielectric material comprises depositing the second dielectric material over the intervening dielectric material.

15. The method of claim 11, further comprising:
surrounding the via post with the second dielectric material;
etching a second via opening into the second dielectric material exposing a top surface of the via post, the second via opening extending beyond an edge of the via post top surface, and exposing a portion of a sidewall of the via post; and
depositing a second interconnect feature within the second via opening, the second interconnect feature contacting the top surface and sidewall of the via post.

16. An integrated circuit (IC) interconnect structure, comprising:
a pair of first conductive interconnect features embedded within a first dielectric material disposed over a substrate and spaced laterally apart by a first space;
a conductive via post disposed in direct contact with a top surface one of the first conductive interconnect features;
a second conductive interconnect feature embedded within a second dielectric material disposed over the first dielectric material, and disposed in direct contact with a top surface of the via post, wherein the second interconnect feature is laterally misaligned from the via post with a bottom surface of the second interconnect feature overlapping the first space and separated from the first dielectric material by at least a portion of the height of the via post.

17. The IC structure of claim 16, further comprising an intervening dielectric material disposed over the top surface of the pair of first interconnect features in regions where the via post is absent, and wherein the intervening dielectric material is further absent from at least a portion of the first space.

18. The IC structure of claim 16, wherein:
the pair of first interconnect features comprises a pair of interconnect lines including a fill metal of a first composition, and an interconnect liner of a second composition cladding the sidewalls of the fill metal;
the second interconnect feature comprises a third interconnect line including the fill metal, and the interconnect liner cladding the sidewalls of the fill metal;
the via post is in contact with the fill metal of one of the pair of first interconnect features and is in contact with an interconnect liner of the third interconnect line; and
the via post has a third composition, distinct from the interconnect fill metal and cladding.

19. The IC structure of claim 16, wherein the via post comprises at least one of Ni, Cu, Co, Ru, Pd, Pt, or Au, and is doped with P, C, W, or B impurities.

* * * * *